(12) United States Patent
Pellizzer et al.

(10) Patent No.: US 9,064,565 B2
(45) Date of Patent: *Jun. 23, 2015

(54) PHASE CHANGE MEMORY DEVICE (71) Applicant: Micron Technology, Inc., Boise, ID (US)

(72) Inventors: Fabio Pellizzer, Cornate d'Adda (IT); Roberto Bez, Milan (IT); Ferdinando Bedeschi, Biassono (IT); Roberto Gastaldi, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/047,605

(22) Filed: Oct. 7, 2013

(65) Prior Publication Data
US 2014/0036583 A1    Feb. 6, 2014

Related U.S. Application Data

(63) Continuation of application No. 12/442,392, filed as application No. PCT/EP2007/057706 on Jul. 27, 2006, now Pat. No. 8,553,453.

(51) Int. Cl.
*G11C 13/00* (2006.01)
*G11C 11/56* (2006.01)
(Continued)

(52) U.S. Cl.
CPC ............ *G11C 13/0004* (2013.01); *G11C 11/56* (2013.01); *G11C 11/5678* (2013.01); *G11C 13/004* (2013.01); *G11C 2013/0054* (2013.01); *G11C 2213/79* (2013.01); *H01L 27/2427* (2013.01); *H01L 27/2463* (2013.01); *H01L 45/04* (2013.01); *H01L 45/06* (2013.01);
(Continued)

(58) Field of Classification Search
CPC .................................................. G11C 13/0004
USPC .......................................................... 365/163
See application file for complete search history.

(56) References Cited

U.S. PATENT DOCUMENTS 8,553,453 B2    10/2013  Pellizzer et al.
2002/0176281 A1  11/2002  Tang
(Continued)

FOREIGN PATENT DOCUMENTS

CN    101443914       8/2011
EP    1450373 A1      8/2004
(Continued)

OTHER PUBLICATIONS

"Chinese Application Serial No. 200780017151.6, Notice of Allowance mailed Apr. 21, 2011", 1 pg.
(Continued)

*Primary Examiner* — Hoai V Ho
*Assistant Examiner* — Min Huang
(74) *Attorney, Agent, or Firm* — Schwegman Lundberg & Woessner, P.A.

(57) ABSTRACT

A phase change memory device with memory cells is formed from a phase change memory element and a selection switch. A reference cell is formed from a similar phase change memory element and an associated selection switch and is associated to a group of memory cells to be read. An electrical quantity of the group of memory cells is compared with an analogous electrical quantity of the reference cell, thereby compensating for drift in the properties of the memory cells.

20 Claims, 5 Drawing Sheets (51) Int. Cl.
*H01L 27/24* (2006.01)
*H01L 45/00* (2006.01)

(52) U.S. Cl.
CPC .......... *H01L45/1233* (2013.01); *H01L 45/126* (2013.01); *H01L 45/143* (2013.01); *H01L 45/144* (2013.01)

(56) References Cited

U.S. PATENT DOCUMENTS

| | | | |
|---|---|---|---|
| 2003/0026134 | A1 | 2/2003 | Lowrey |
| 2003/0189853 | A1* | 10/2003 | Tanizaki et al. ............... 365/200 |
| 2004/0017718 | A1 | 1/2004 | Ooishi |
| 2005/0024922 | A1 | 2/2005 | Li et al. |
| 2005/0029505 | A1 | 2/2005 | Lowrey |
| 2005/0122768 | A1* | 6/2005 | Fukumoto .................... 365/158 |
| 2006/0072357 | A1 | 4/2006 | Wicker |
| 2006/0279979 | A1 | 12/2006 | Lowrey et al. |
| 2007/0014144 | A1* | 1/2007 | Wicker ......................... 365/148 |
| 2007/0019465 | A1 | 1/2007 | Bedeschi et al. |
| 2007/0247940 | A1 | 10/2007 | Liaw et al. |
| 2007/0279996 | A1* | 12/2007 | Rolandi et al. .......... 365/185.22 |
| 2010/0165719 | A1 | 7/2010 | Pellizzer |

FOREIGN PATENT DOCUMENTS

| | | |
|---|---|---|
| EP | 1511042 A1 | 3/2005 |
| JP | 2009545095 A | 12/2009 |
| WO | WO-2005017904 A1 | 2/2005 |

OTHER PUBLICATIONS

"Chinese Application Serial No. 200780017151.6, Office Action mailed Jan. 22, 2010", 7 pgs.
"Chinese Application Serial No. 200780017151.6, Office Action mailed Sep. 9, 2010", 5 pgs.
"Chinese Application Serial No. 200780017151.6, Response filed Jun. 7, 2010 to Office Action mailed Jan. 22, 2010", No English Translation.
"Chinese Application Serial No. 200780017151.6, Response filed Nov. 15, 2010 to Office Action mailed Sep. 9, 2010", No English Translation.
"European Application Serial No. 06425531.8, European Search Report mailed Jan. 30, 2007", 1 pg.
"European Application Serial No. 06425531.8, Office Action mailed Feb. 4, 2008", 2 pgs.
"European Application Serial No. 06425531.8, Office Action mailed Apr. 2, 2009", 3 pgs.
"European Application Serial No. 06425531.8, Office Action mailed Sep. 1, 2008", 1 pg.
"European Application Serial No. 06425531.8, Office Action mailed Oct. 15, 2009", 4 pgs.
"European Application Serial No. 06425531.8, Office Action mailed Oct. 22, 2008", 1 pg.
"European Application Serial No. 06425531.8, Response filed Mar. 9, 2009 to Office Action mailed Sep. 1, 2008", 2 pg.
"European Application Serial No. 06425531.8, Response filed Aug. 5, 2009 to Office Action mailed Apr. 2, 2009", 16 pgs.
"International Application Serial No. PCT/EP2007/057706, International Search Report mailed Oct. 24, 2007", 4 pgs.
"International Application Serial PCT/EP2007/057706, Written Opinion mailed Oct. 24, 2007", 6 pgs.
"Japanese Application Serial No. 2009-521273, Office Action mailed May 14, 2012", With English Translation, 9 pgs.
"Japanese Application Serial No. 2009-521273, Response filed Nov. 1, 2012 to Office Action mailed May 14, 2012", 7 pgs.
"Korean Application Serial No. 10-2009-7003416, Office Action mailed Aug. 20, 2013", 5 pgs.
"Korean Application Serial No. 10-2009-7003416, Response filed Oct. 21, 2013 to Office Action mailed Aug. 20, 2013", 37 pgs.

* cited by examiner

PHASE CHANGE MEMORY DEVICE

PRIORITY APPLICATION

This application is a continuation of U.S. application Ser. No. 12/442,392, entitled "Phase Change Memory Device," which was filed on Feb. 22, 2010 and is now issued as U.S. Pat. No. 8,553,453, and which is hereby incorporated herein by reference in its entirety.

TECHNICAL FIELD

The present invention relates to a phase change memory device, in particular to a phase change memory device having ovonic threshold switch selectors.

BACKGROUND ART

As known, phase change memories use a class of materials that have the property of switching between two phases having distinct electrical characteristics, associated to two different crystallographic structures of the material, and precisely an amorphous, disorderly phase and a crystalline or polycrystalline, orderly phase. The two phases are hence associated to resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$), which is now widely used for storing information on overwritable disks and has been also proposed for mass storage.

In the chalcogenides, the resistivity varies by two or more orders of magnitude when the material passes from the amorphous (more resistive) phase to the crystalline (more conductive) phase, and vice versa.

Phase change can be obtained by locally increasing the temperature. Below 150° C., both phases are stable. Starting from an amorphous state, and rising the temperature above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then rapidly cool off the chalcogenide.

Memory devices exploiting the properties of chalcogenic materials (also called phase change memory devices) have been already proposed.

Figure 1:
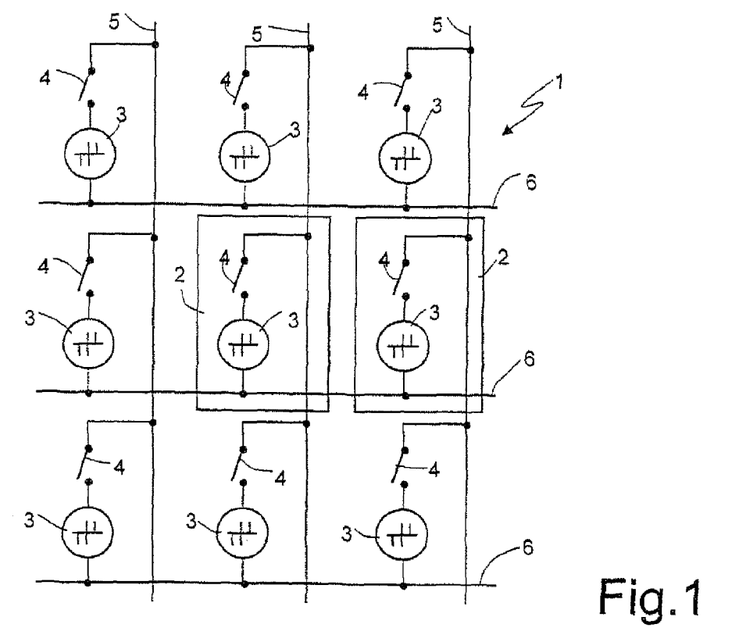
FIG. 1 shows the architecture of a memory array.

In a phase change memory including chalcogenic elements as a storage element, memory cells are arranged in rows and columns to form an array, as shown in FIG. 1. The memory array 1 of FIG. 1 comprises a plurality of memory cells 2, each including a memory element 3 of the phase change type and a selection element 4. The memory cells 2 are interposed at cross-points between rows 6 (also called word lines) and columns 5 (also called bitlines).

In each memory cell 2, the memory element 3 has a first terminal connected to an own wordline 6 and a second terminal connected to a first terminal of an own selection element 4. The selection element 4 has a second terminal connected a bitline 5. In another solution, the memory element 3 and the selection element 4 of each cell 2 may be exchanged in position.

The composition of chalcogenides suitable for the use in a phase change memory device and a possible structure of a phase change memory cell are disclosed in a number of documents (see, e.g., U.S. Pat. No. 5,825,046).

Phase change memory cells comprise a chalcogenic material (forming a proper storage element) and a resistive electrode, also called heater (see, e.g., EP-A-1 326 254, corresponding to US-A-2003/0185047).

From an electrical point of view, the crystallization temperature and the melting temperature are obtained by causing an electric current to flow through the resistive electrode in contact or close proximity with the chalcogenic material and thus heating the chalcogenic material by Joule effect.

In particular, when the chalcogenic material is in the amorphous, high resistivity state (also called the reset state), it is necessary to apply a voltage/current pulse of a suitable length and amplitude and allow the chalcogenic material to cool slowly. In this condition, the chalcogenic material changes its state and switches from a high resistivity to a low resistivity state (also called the set state).

Vice versa, when the chalcogenic material is in the set state, it is necessary to apply a voltage/current pulse of suitable length and high amplitude so as to cause the chalcogenic material to switch to the amorphous phase.

The selection element is implemented by a switching device, such as a PN diode, a bipolar junction transistor or a MOS transistor.

For example, U.S. Pat. No. 5,912,839 describes a universal memory element using chalcogenides and including a diode as a switching element. The diode may comprise a thin film such as polycrystalline silicon or other materials.

Figure 2A:
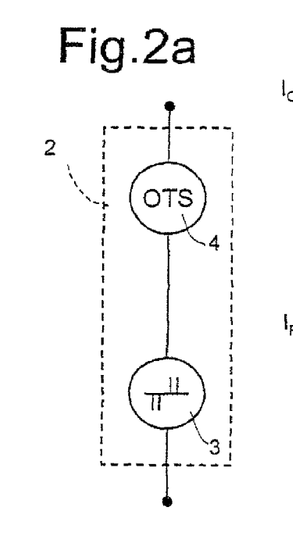
FIG. 2a shows the electric equivalent of a memory cell having an ovonic switch.

GB-A-1 296 712 and U.S. Pat. No. 3,573,757 disclose a binary memory formed by an array of cells including a switch element called "ovonic threshold switch" (also referred to as an OTS hereinafter), connected in series with a phase change memory element PCM also called "ovonic memory switch". The OTS and the PCM are formed adjacent to each other on an insulating substrate and are connected to each other through a conducting strip. FIG. 2a shows the electrical equivalent of a memory cell 2 having a memory element 3 and an ovonic switch 4.

The PCM is formed by a chalcogenic semiconductor material having two distinct metastable phases (crystalline and amorphous) associated to different resistivities, while the OTS is built with a chalcogenic semiconductor material having one single phase (generally amorphous, but sometimes crystalline) with two distinct regions of operation associated to different resistivities. If the OTS and the PCM have substantially different high resistances, namely with the OTS having a higher resistance than the PCM, when a memory cell is to read, a voltage drop is applied to the cell that is insufficient to trigger the PCM when the latter is in its high resistance condition (associated with a digital "0" state), but is sufficient to drive the OTS in its low resistance condition when the PCM is already in its low resistance condition (associated with a digital "1" state).

OTS (see, e.g., U.S. Pat. No. 3,271,591 and US2006073652, describing its use in connection with memory elements of the phase change type) have the characteristic shown in FIG. 2b; FIG. 2c shows the characteristic of a reset memory element PCM (with continuous line) and the characteristic of a set PCM (with dashed line).

Figure 2B:
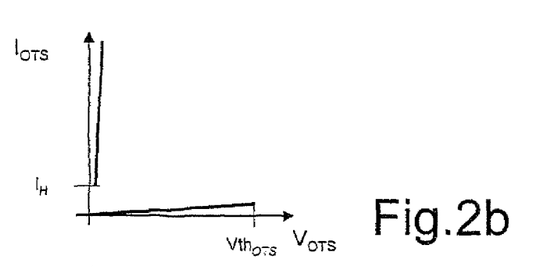
FIGS. 2b and 2c plot the current vs. voltage characteristics of an ovonic switch and of a phase change memory element.
Figure 2C:
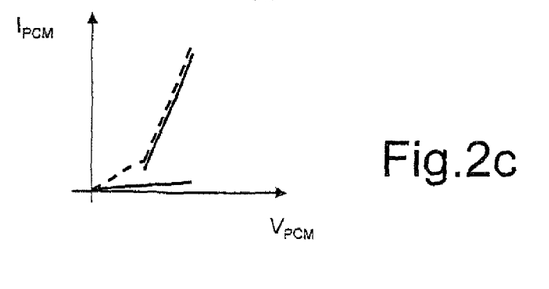

As shown in FIG. 2b, an OTS has a high resistance for voltages below a threshold value $V_{th,OTS}$; when the applied voltage exceeds the threshold value $V_{th,OTS}$, the switch begins to conduct at a substantially constant, low voltage and has a low impedance. In this condition, if the PCM is set, as visible from FIG. 2c, the memory cell is on; if the PCM is reset, the memory cell is off.

When the current through the OTS falls below a holding current $I_H$, the OTS goes back to his high-impedance condition. This behavior is symmetrical and occurs also for negative voltages and currents (not shown).

As shown in FIG. 2c, in the amorphous state (reset) a PCM has a plot similar to the plot of an OTS; when crystalline, the PCM has a higher conductance in the lower portion of the characteristic and about the same behaviour of the reset cell in the upper portion.

In OTS, the threshold voltage $V_{th}$ is subject to a drift. The threshold voltage drift is harmful for OTS-selected memory arrays, because it could prevent the storage element of chalcogenic material from being correctly read.

In fact, as immediately recognizable from the comparative observation of FIGS. 2b and 2c, if the threshold voltage $V_{th}$ of the selector is not known with satisfactory precision, and the chalcogenic storage element is crystalline (and thus stores a logical "1") it could be read as a logical "0" because, at the reading voltage, the selector has not yet switched to the conductive state. Analogously, a reading error may occur if the chalcogenic storage element is amorphous (and thus stores a logical "0") but at the reading voltage the element is already in the higher portion of the curve of FIG. 2c.

In other words, the ideal reading voltage is limited between the threshold voltage of the OTS ($V_{th,OTS}$) and the sum of both threshold voltages ($V_{th,OTS}+V_{th,PCM}$) and the exact knowledge of $V_{th,OTS}$ is thus crucial in order to maximize the reading window.

In general, it may be impossible to determine the value of a stored bit if the threshold of the selector switch is not known.

To solve this problem, peculiar chalcogenide materials are being tested that do not show drift. In the alternative, or as an additional solution, electrode materials are being studied that are able to reduce this problem. However, currently all the materials suitable for the use in phase change memory devices are affected by the threshold drift.

Furthermore, it has been noted that also PCMs undergo a drift of the reset resistance ($R_{reset}$) with time, which causes a variation in the slope of the curves in FIG. 2c. The drift in the reset resistance poses some problems for multilevel storage based on phase change memories, because intermediate levels of crystallization, corresponding to different levels of resistance, are used to store different bits. Thus, the resistance drift may cause reading errors.

DISCLOSURE OF INVENTION

The object of the invention is thus to provide a solution to the drift problem of the chalcogenide materials.

According to the present invention, there are provided a system including a phase change memory device, a momory array including a plurality of phase change memory elements, and a reading method thereof, as defined in various ones of the claims.

In practice, to solve the problem of the drift, each group of memory cells to be read (e.g., all the memory cells arranged on a same row) are associated to one or more reference cells (also called SLC=Single-Level Cell for the single cell and MLC=Multi-Level Cell for multiple reference cells) having the same structure as the associated memory cells. The reference cells may be formed adjacent to the respective memory cells.

Therefore, the reference cells have the same drift in the threshold voltage $V_{th}$ and in the resistance as the memory cells.

During programming, all the memory cells belonging to a same group are programmed together (simultaneously or immediately before or after) with their reference cell(s). If the whole programming operation is performed within a time span of 1-10 μs, it is possible to guarantee the consistency of the electric properties (threshold voltage or resistance) of all the memory cells and their reference cell(s).

During reading, the memory cells are compared with their reference cell(s); thereby it is ensured that any drift affecting an electrical quantity (threshold voltage or resistance) of the memory cells is shared also by the reference cell(s), thereby ensuring a reliable reading of all the memory cells associated to the reference cell(s).

In particular, the problem associated with the drift of the threshold voltage of the OTS selection element may be solved using reference cell(s) having own threshold switches (in the following indicated as threshold reference cell(s)) and the threshold reference cell(s) may be programmed in the set state, so that they switch on when the voltage applied thereto reaches the threshold voltage $V_{th,OTS}$.

Furthermore, by arranging the cells to be read and the threshold reference cell(s) along a same row, the switching of the threshold reference cell(s) may be exploited for all the memory cells to be read, thereby obtaining a simultaneous reading thereof.

For solving the problem of the resistance drift, it is not necessary to use reference cell(s) having Ovonic Threshold Switches, but the switches may be of any type, for example bipolar or MOS transistors. In this case the reference cells generate the reference values that are compared with the memory cell during reading.

BRIEF DESCRIPTION OF THE DRAWINGS

For the understanding of the present invention, preferred embodiments thereof are now described, purely as a non-limitative example, with reference to the enclosed drawings, wherein.

BEST MODE FOR CARRYING OUT THE INVENTION

Figure 3:
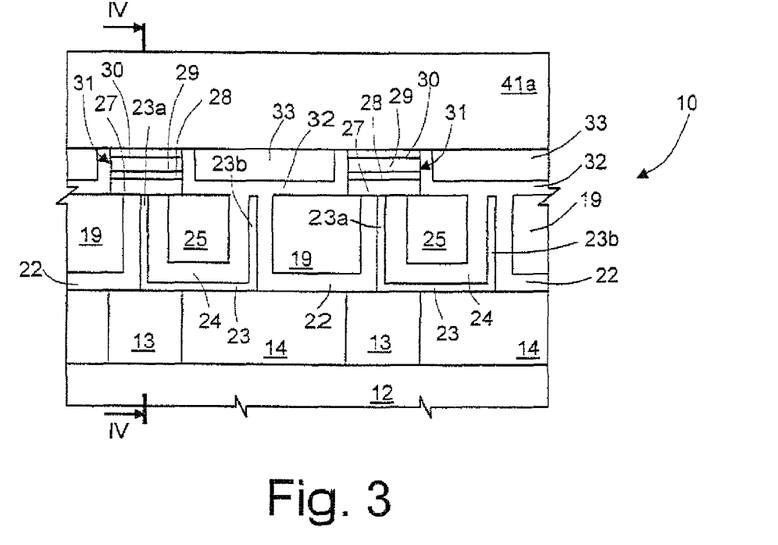
FIGS. 3 and 4 are cross-section taken along crossing planes of phase change memory cell including an ovonic switch.
Figure 4:
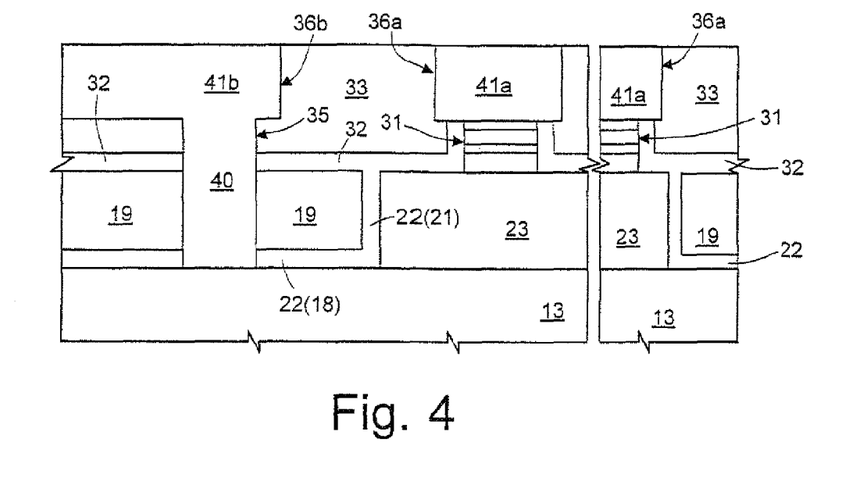

FIGS. 3 and 4 show an exemplary structure of a phase change memory cell including an ovonic switch.

In detail, a semiconductor substrate (not shown) is coated with an insulating layer 12. Row lines 13, e.g. of copper, extend on top of the insulating layer 12, insulated from each other by a first dielectric layer 14. A protective region 22 and a first oxide layer 19 encapsulate a heater structure 23 of, e.g., TiSiN, which has a cup-like shape and is internally covered by a sheath layer 24, e.g. of silicon nitride, and filled by a second oxide layer 25.

The memory cells include PCM/OTS (Ovonic Memory Switch/Ovonic Threshold Switch) stacks or dots 31, each comprising a storage region 27 (e.g., $Ge_2Sb_2Te_5$), a first barrier region 28 (e.g., TiAlN), a switching region 29 (e.g., $As_2Se_3$) and a second barrier region 30 (e.g., TiAlN) extend on and in contact with walls 23a of the heater structures 23. FIG. 3 shows two dots 31 which extend substantially aligned along a column 5 of the array 1 (see FIG. 1) while FIG. 4 shows one and a half dots 31 which extend substantially aligned along a row 6 of the array. The dots 31 are sealed and insulated by a sealing layer 32, e.g., of silicon nitride, and by an intermetal layer 33 of e.g. of silicon dioxide.

Vias openings 35 extend through the intermetal layer 33, the sealing layer 32, the first oxide layer 19 and the protective region 22 down to the row lines 13, while trenches 36a, 36b extend through the intermetal layer 33 down to the top of the dots 31 or vias opening 35. Vias 40, column lines 41a and row line connections 41b are formed in the vias openings 35 and in the trenches 36a, 36b. Column lines 41a correspond to the bitlines 5 while row lines 13 correspond to word lines 6 of FIG. 1. Thus each dot 31 is formed at the intersection between a row line 13 and a column line 41a.

Figure 5:
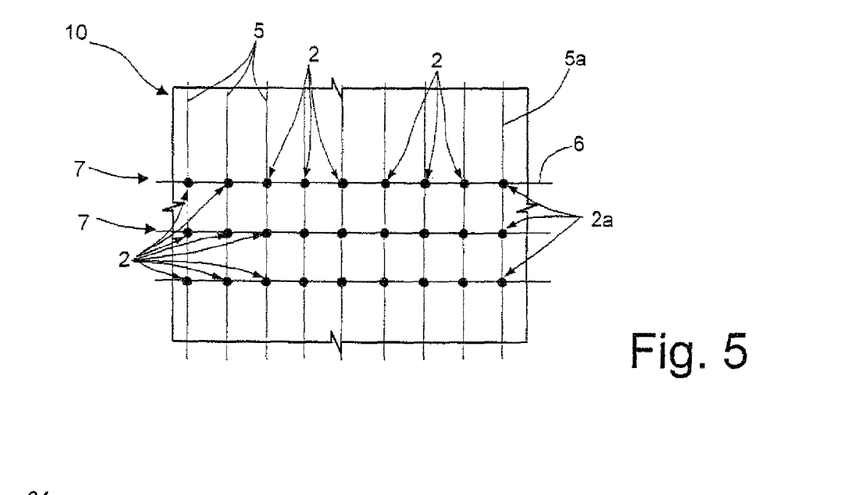
FIG. 5 shows the organization of an embodiment of the present phase change memory device.

FIG. 5 shows an embodiment of a memory array 10 according to the invention. Memory array 10 comprises a plurality of wordlines 6 and a plurality of data bitlines 5. Memory cells 2 are arranged at the cross points of the wordlines 6 and the bitlines 5. Groups 7 of eight memory cells 2 along a same wordline 6 form a word and are associated to an own threshold reference cell 2a. Each threshold reference cell 2a is formed next to the associated group 7 of memory cells 2 and is connected to the same word line 6 of the associated group; the threshold reference cells 2a are coupled to own bitlines, called reference bitlines 5a.

During reading, the data bitlines 5 of all the memory cells 2 belonging to the word to be read receive a biasing voltage, which is a generally increasing voltage, for example a ramp voltage. Simultaneously, also the reference bitline 5a receives the biasing voltage. When the switching of the threshold reference cell 2a is detected, after a small and pre-defined delay, the voltage ramp on the word line 6 may be stopped and the currents of all the memory cells 2 being read may be detected.

Therefore, when the content of the addressed memory cells 2 is read, it is ensured that all the OTS 4 thereof have switched, even if the threshold voltage has drifted, since their reference cell 2a undergoes any such threshold voltage drift.

During programming, the memory element of the threshold reference cell 2a may be set by applying a long and reliable voltage pulse, thus triggering the ovonic switch thereof, and then the memory cells 2 associated to the just set threshold reference cell 2a are programmed (set or reset) by applying voltage/current pulses of suitable amplitude and length. Preferably, the memory cells 2 are programmed as soon as possible after or before programming the threshold reference cell 2a.

Figure 6:
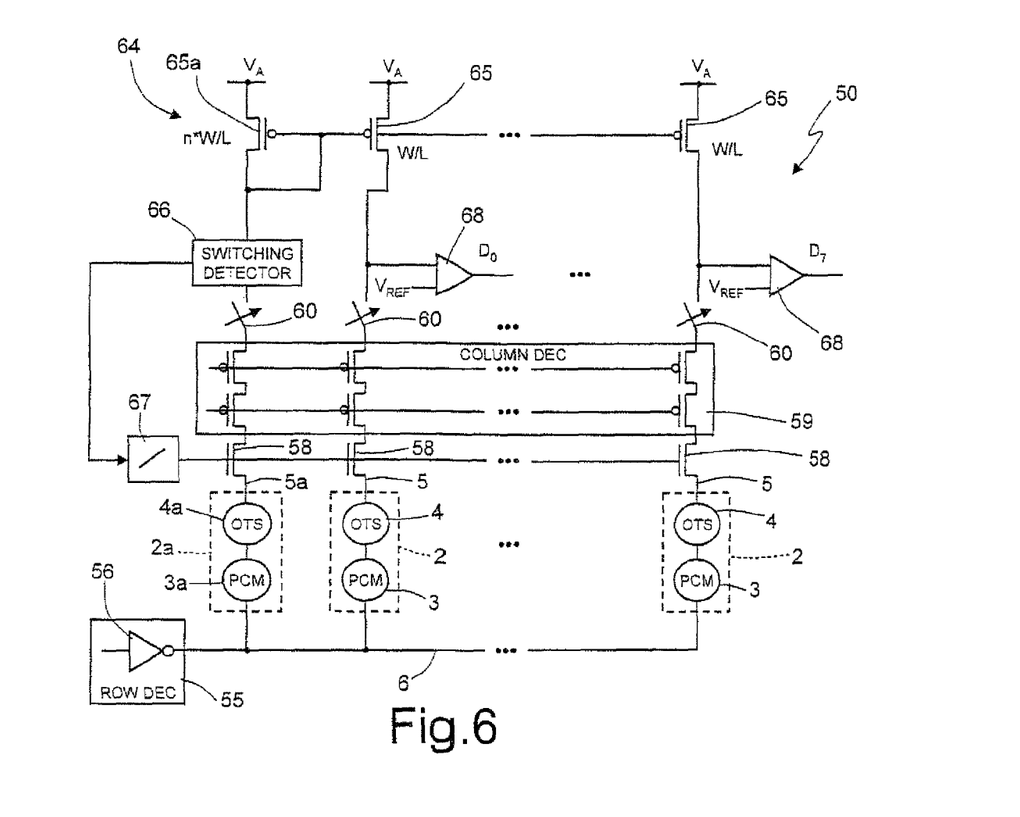
FIG. 6 shows a circuit diagram of a phase change memory sensing device, according to a first embodiment.

FIG. 6 shows an implementation of a reading circuit 50 that may be used with the above described memory architecture.

In FIG. 6, word line 6 is shown connected to a final driver 56 of a row decoder 55. Bitlines 5 and 5a are connected to cascode transistors 58 of the NMOS type that regulate the voltage on the bitlines 5, 5a and in particular apply a ramp voltage thereto.

The cascode transistors 58 are connected, through a column decoder 59, shown only partially, and respective switches 60, to respective data loads 65 and reference load 65a, formed by PMOS transistors. In particular, data loads 65 have drain terminals connectable to the data bitlines 5 while the reference load 65a has a drain terminal connectable to the reference bitline 5a. The loads 65, 65a have source terminals connected to a supply voltage $V_A$ and are connected together in a mirror-like configuration; thus, they have gate terminals connected together and the reference load 65a has shorted gate and drain terminals. Preferably, the reference load 65a has an aspect ratio (ratio between the width and the length of the load transistors) n times higher than the data loads 65. Therefore, the current read on the reference branch is mirrored in the data branches divided by n. The actual ratio could be optimized to the specific application. Thus, the loads 65, 65a form a current/voltage converter 64.

A switching detector 66 is coupled between the reference load 65a and the column decoder transistors connected to the reference bitline 5a. However, the switching detector 66 may be located also between the column decoder 59 and the reference bitline 5a or any other suitable position. The switching detector 66 is any suitable circuit able to detect when the current through the reference bitline 5a exceeds a preset reference value, thus detecting switching on of the OTS 4 of the threshold reference cell 2a. For example, the switching detector 66 could be implemented using a comparator having a first input coupled to the reference bitline 5a, a second input coupled to the reference value, and an output that supplies a signal based on a comparison of the two inputs. The switching detector 66 generates a control signal for a voltage generator 67 connected to the gate of the NMOS cascode transistors 58, thus stopping the voltage ramp.

Comparators 68 compare the voltage at the drain terminals of the data loads 65 (outputs of the current/voltage converter 64) with a reference value $V_{REF}$. The outputs of the comparators 68 represent data bits $D_0$-$D_7$.

The switches 60 are closed during reading but are open during programming, thus disconnecting the memory cells 2, 2a from the loads 65, 65a. In this phase, the memory cells 2, 2a are connected to dedicated pumps, of the current-controlled or voltage-controlled type, in a per se known manner.

From the above it is clear that all the memory cells (both data and threshold reference cells) in a string or word have cycle lives which are always synchronized, since they are always programmed together, thus compensating any possible drift of their threshold voltage Vth due to cycling.

Figure 7:
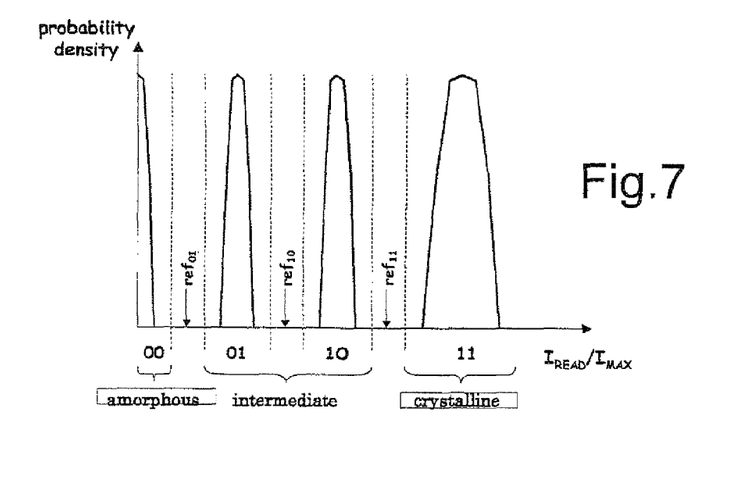
FIG. 7 is a plot showing the distribution of read current for multi-level programming.

FIG. 7 shows a plot of the probability density versus current for a four-state PCM cell (additional states may be added by further sub-dividing the current ranges as is well-known in the art). Here, "00" corresponds to an amorphous state associated with reset bits. Level "11" corresponds to a crystalline state associated to set bits. Intermediate levels "01" and "10" correspond to partially crystalline states.

The reset state is typically obtained with a single square pulse (e.g., 50 ns) that drives the chalcogenide material to a melting point of approximately 600° C. and then rapidly cools it.

The set state is typically obtained with a single square pulse that drives the chalcogenide material up to crystallization temperature (e.g. 400° C.) and maintains it there until long-range order is reconstructed. Alternatively, set can be obtained by driving the chalcogenide material to the melting point and then cooling it slowly enough for the crystals to reorganize.

The intermediate states "01", "10" may require additional programming pulses and the creation of a percolation path, as described e.g. in European patent application 05104877.5 filed on 3 Jun. 2005.

$ref_{01}$, $ref_{10}$, and $ref_{11}$ are reference currents at intermediate levels generated by reference cells programmed in a same programming operation as the memory cells 2 and used during reading in order to sense the state of the memory cells 2, thus replacing absolute reference values, that are not able to track the drift of the memory cells.

Since the drift of resistance is proportional to the amorphous portion of the storage region 27 (see FIG. 3), it could be advantageous to place the intermediate levels ("01" and "10" in this case) close to "11", i.e. the fully crystalline state.

During reading, the resistance drift of the reference cells allows to track the window associated with the intermediate levels.

In this case, we don't require the presence of an OTS selector, because the technique could be applied with any kind of selector associated to the PCM.

Such a solution does not require a switching detector on the bitline associated to the reference bits, and it is possible to simply verify the bits stored in the memory cells against the reference bits, using them one at a time.

Figure 8:
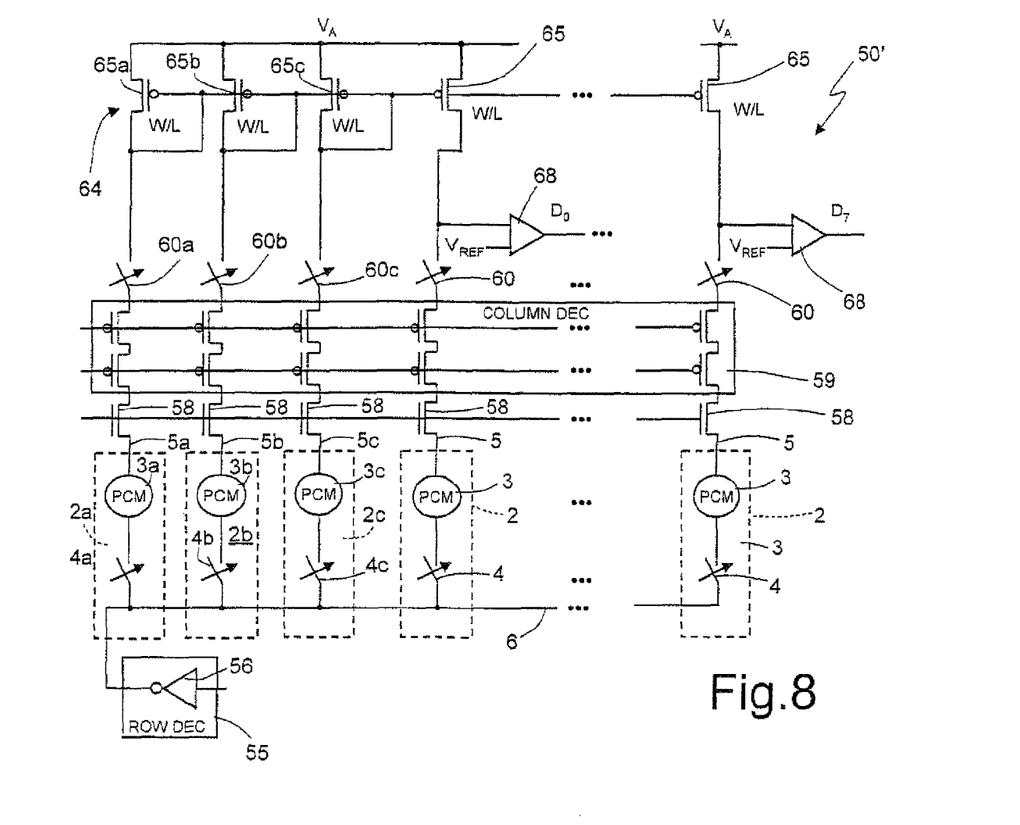
FIG. 8 shows a circuit diagram of a phase change memory sensing device, according to a second embodiment.

FIG. 8 shows and embodiment of a reading circuit 50' that may be used for tracking resistance drift. In FIG. 8, the same reference numbers have been used for elements in common with the reading circuit 50 of FIG. 6 and the following description refers only to the differences between the reading circuits 50 and 50'.

In detail, the reading circuit 50' of FIG. 8 comprises a plurality of reference bitlines 5a, 5b, and 5c (here three, the same number as the reference levels used to discriminate the possible states of the memory cells 2). Here, the selection elements 4 are of generic type. Each reference bitline 5a, 5b, 5c is connected to an own reference cell 2a, 2b and 2c, to an own cascode transistor 58, to an own switch 60a, 60b, 60c, and to an own reference load 65a, 65b, 65c. The reference loads 65a, 65b, 65c have a same aspect ratio W/L, equal to the aspect ratio of the data loads 65. No switching detector 66 is provided for.

During programming, the reference cell 2a, 2b and 2c are programmed each to an own threshold voltage, corresponding to a respective reference value $ref_{01}$, $ref_{10}$, and $ref_{11}$ of FIG. 7.

During reading, the switch 60a are closed in sequence, thus feeding the data bitlines 5 with a current equal to the current flowing in one reference cell 5a, 5b, 5c at time; thus the comparators 68 compare each time the reference value $V_{REF}$ to the output voltages of the current/voltage converter 64 for three different biasing currents (corresponding to the above three reference values). The output of the comparators 68 is used by a hardware or software stage (not shown) configured to extract the complete and correct data, as known in the art of multilevel memories.

Basically, for each memory cell 2 of the group of words 7, the memory cell 2 is connected to a first reference cell 2a through the current/voltage converter 64; a first electrical quantity (current) of the memory cell 2 is read; then the memory cell 2 is connected to a second reference cell 2b through the current/voltage converter 64; a second electrical quantity (current) is read. The process is then repeated for all the intermediate levels provided for. In the embodiment of FIG. 8, the third reference cell 2c is connected and the output voltage of the converter is compared to the reference value. Then, the state of the memory cell 2 and thus the stored bits is detected based onto the read electrical quantity.

Obviously, a similar approach and a similar reading circuit may be used in case of a different number of levels stored in the memory cells 2, e.g., in case of only three levels or more than four levels. Obviously, in this case, the number of reference cells 2a-2c depends on the number of levels to be stored, being sufficient a number of reference cells equal to the number of desired levels minus 1.

Other sequences of selection for the reference cells are also possible, based on the reading algorithm chosen among those known in the art of multilevel memories.

Figure 9:
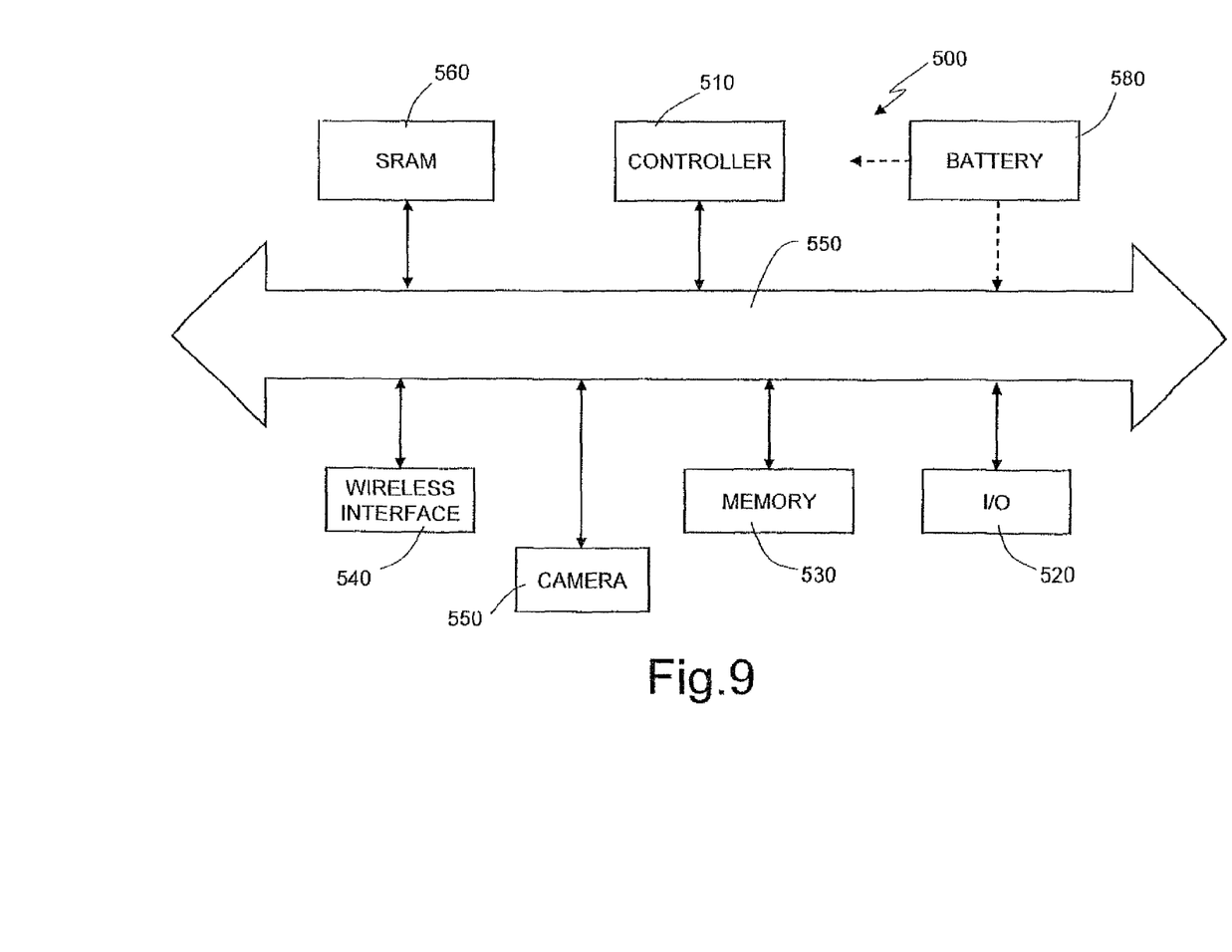
FIG. 9 is a system depiction according to one embodiment of the present invention.

FIG. 9 shows a portion of a system 500 in accordance with an embodiment of the present invention. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wireless. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, a digital camera 550, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may comprise one or more different types of memory. For example, memory 530 may comprise a volatile memory (any type of random access memory), a non-volatile memory such as a flash memory, and memory 1 illustrated in FIG. 1 incorporating the architecture described with reference to FIGS. 5-8.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

Finally, it is clear that numerous variations and modifications may be made to the phase change memory device and the reading and programming methods described and illustrated herein, all falling within the scope of the invention as defined in the attached claims.

What is claimed is:

1. A system comprising:
   a memory array comprising a number of phase change memory elements, the number of phase change memory elements arranged in groups with each group being coupled to a respective row line;
   a number of reference cells each including a reference phase change memory element, each of the number of reference cells being coupled only to a respective one of each of the groups through the respective row line for the group, the number of reference cells each having a substantially same structure to the phase change memory elements within the respective group; and a reading stage and reference column line switches, the system being configured to use the reference column line switches to couple the reading stage to the memory array, the system further configured to activate the reference column line switches in sequence to feed current from one of the number of reference cells coupled to a specific one of the respective row lines during a read operation occurring in the respective row line.

2. The system of claim 1, wherein the number of reference cells is equivalent to the number of row lines.

3. The system of claim 1, wherein the reading stage includes a current/voltage converter couplable to data column lines and reference column lines through respective data column line switches and reference column line switches.

4. The system of claim 1, wherein there are eight phase change memory elements in a group comprising a data word.

5. The system of claim 1, wherein each of the phase change memory elements of the memory array are selectively programmable in at least a set state and a reset state and the phase change memory elements of the number of reference cells are programmed in the set state.

6. The system of claim 1, further comprising a second number of reference cells in each group, the second number to be equivalent to a number of possible states to which the memory cells are programmable.

7. The system of claim 6, wherein each of the second number of reference cells within each of the specific row lines is respectively programmed to a first intermediate state, a second intermediate state, and a set state.

8. The system of claim 1, wherein the phase change memory elements within a group and the reference cell coupled to the specific row line of the group are physically arranged adjacent to each other.

9. The system of claim 1, wherein each of the groups of phase change memory elements forms a respective data word.

10. The system of claim 1, further comprising a separate threshold switch coupled to each of the plurality of reference cells.

11. The system of claim 1, wherein the reading stage further comprises a threshold detector selectively coupled to each of the number of reference cells to detect an electrical quantity of the reference cells reaching a threshold value.

12. A memory array comprising:
a plurality of phase change memory elements arranged in rows and columns, each of the plurality of phase change memory elements having a data selecting element to couple a respective one of the plurality of phase change memory elements to a data column line, the plurality of phase change memory elements further being arranged in groups where each group is coupled to a respective row line; and
a plurality of reference cells each including a reference phase change memory element and a reference selecting element to couple a respective one of the plurality of reference cells to a reference column line, each of the plurality of reference cells being arranged in proximity and formed adjacent to a respective one of the groups and coupled only to the respective row line for the group, the plurality of reference cells and associated ones of the reference selecting elements each having a substantially same structure to the phase change memory elements and associated ones of the data selecting elements within the respective group such that the plurality of reference cells and the associated ones of the reference selecting elements within each respective group share substantially the same resistance drift and threshold voltage drift, respectively, as the plurality of phase change memory elements and the associated ones of the data selecting elements within the respective group.

13. The memory array of claim 12, further comprising a reading stage couplable to the memory array, the reading stage having a current/voltage converter connectable to the data column lines and the reference column lines through respective ones of the data switching elements and the reference switching elements.

14. The memory array of claim 12, wherein the reference switching elements are to be activated in sequence during a read operation of the group.

15. The memory array of claim 12, wherein the number of reference cells is equivalent to the number of groups.

16. A method of reading a memory device, the method comprising:
for each of a plurality of memory cells coupled in groups along a common row line with each row line having a reference cell coupled only to a respective one of the common row lines for the respective groups, each of the reference cells having a substantially same structure to the memory cells along the common row line,
sequentially coupling each of the plurality of reference cells to a comparator, each of the reference cells being programmed to a pre-defined threshold voltage corresponding to a respective reference value; and
comparing an electrical behavior of each of the plurality of memory cells and of the sequentially coupled ones of the plurality of reference cells to determine a value of the memory cells being read.

17. The method of claim 16, further comprising accounting for a drift in a resistance value of each of the plurality of memory cells by programming an associated one of the reference cells proximate in time to a programming operation of a respective one of the plurality of memory cells.

18. The method of claim 17, wherein proximate in time is in a range of about 1 μs to about 10 μs of either before or after of the programming of respective ones of the plurality of memory cells.

19. The method of claim 16, further comprising comparing a resistance value of each of the plurality of memory cells with an associated one of the reference cells during a read operation.

20. The method of claim 16, further comprising:
applying a bias voltage to data bit lines coupled to respective ones of the plurality memory cells to be read within a row line; and
simultaneously supplying the bias voltage to reference bit lines coupled to selected ones of the reference cells within the row line.

* * * * *